(12) United States Patent
Hung et al.

(10) Patent No.: US 10,705,639 B2
(45) Date of Patent: Jul. 7, 2020

(54) ANTI-REFLECTIVE INTEGRATED TOUCH DISPLAY PANEL

(71) Applicant: Au Optronics Corporation, Hsinchu (TW)

(72) Inventors: Chun-Cheng Hung, Taipei (TW); Wen-Jen Li, Hsinchu (TW); Yen-Shih Huang, Hsinchu (TW); Chia-Ming Chen, Hsinchu (TW); Ting-Wei Ko, Hsinchu (TW); Chia-Yuan Yeh, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 15 days.

(21) Appl. No.: 16/260,108

(22) Filed: Jan. 29, 2019

(65) Prior Publication Data

US 2020/0057520 A1 Feb. 20, 2020

(30) Foreign Application Priority Data

Aug. 14, 2018 (TW) .............................. 107128385 A

(51) Int. Cl.
*G06F 3/044* (2006.01)
*G06F 3/041* (2006.01)
*H01L 27/32* (2006.01)
*H01L 51/52* (2006.01)

(52) U.S. Cl.
CPC ............ *G06F 3/0412* (2013.01); *G06F 3/044* (2013.01); *H01L 27/323* (2013.01); *H01L 27/3246* (2013.01); *H01L 27/3272* (2013.01); *H01L 27/3276* (2013.01); *H01L 51/5281* (2013.01)

(58) Field of Classification Search
CPC ..... G06F 3/0412; G06F 3/044; H01L 27/323; H01L 27/3246; H01L 27/3272; H01L 27/3276; H01L 51/5281
See application file for complete search history.

(56) References Cited

U.S. PATENT DOCUMENTS

| | | | |
|---|---|---|---|
| 2015/0169094 A1* | 6/2015 | Liu | G06F 3/044 345/173 |
| 2019/0115407 A1* | 4/2019 | Cho | G09G 3/3225 |

* cited by examiner

*Primary Examiner* — Lisa S Landis
(74) *Attorney, Agent, or Firm* — JCIPRNET

(57) ABSTRACT

An anti-reflective integrated touch display panel includes an anti-reflective structure and touch electrodes. The anti-reflective structure includes a first insulating layer, a second insulating layer disposed on the first insulating layer, a conducting layer disposed on the second insulating layer, a third insulating layer disposed on the second insulating layer, and a fourth insulating layer disposed on the third insulating layer. The first insulating layer includes silicon oxide or silicon nitride, and has a thickness of 0.1 to 2 micrometers. The second insulating layer includes silicon oxide or strontium oxide, and has a thickness of 0.001 to 0.1 micrometer. The conducting layer includes molybdenum, and has a thickness of 0.01 to 0.05 micrometer. The fourth insulating layer includes silicon nitride, and has a thickness of 0.001 to 0.3 micrometer. The touch electrodes are disposed between the third insulating layer and the fourth insulating layer.

10 Claims, 5 Drawing Sheets

ANTI-REFLECTIVE INTEGRATED TOUCH DISPLAY PANEL

CROSS REFERENCE TO RELATED APPLICATION

This application claims the priority benefit of Taiwan application serial no. 107128385, filed on Aug. 14, 2018. The entirety of the above-mentioned patent application is hereby incorporated by reference herein and made a part of specification.

BACKGROUND OF THE DISCLOSURE

Field of the Disclosure

The disclosure relates to a touch panel, and more particularly related to an anti-reflective integrated touch display panel.

Description of Related Art

In the field of organic light-emitting diode (OLED) technology, an active matrix organic light-emitting diode (AMO-LED) is widely used in display devices. Among them, the top-emitting OLED structure has higher aperture ratio and is not affected by the increase in the number of thin film transistors. Nevertheless, due to the high reflectivity of a metal layer in its structure, a circular polarizer is attached to the outside of the package cover to reduce external light reflection to prevent the contrast from being affected.

However, the cost of circular polarizers is expensive and the manufacturing cost of display devices is increased accordingly. The transmittance of the circular polarizers is less than desirable at present so that the brightness of the display device is decreased. As a result, the display quality of the display panel is reduced. In addition, the thickness of the circular polarizers is related to a shift of the neutral axis of the display panel and thus the flexibility of the display panel is reduced.

SUMMARY OF THE DISCLOSURE

An anti-reflective integrated touch display panel of an embodiment of this disclosure includes an anti-reflective structure and a plurality of touch electrodes. The anti-reflective structure includes a first insulating layer, a second insulating layer disposed on the first insulating layer, a conducting layer disposed on the second insulating layer, a third insulating layer disposed on the second insulating layer, and a fourth insulating layer disposed on the third insulating layer. A material of the first insulating layer includes silicon oxide ($Si_xO_y$) or silicon nitride ($SiN_x$), and a thickness of the first insulating layer is 0.1 to 2 micrometers. A material of the second insulating layer includes $Si_xO_y$ or strontium oxide (SrO), and a thickness of the second insulating layer is 0.001 to 0.1 micrometer. A material of the conducting layer includes molybdenum, and a thickness of the conducting layer is from 0.01 to 0.05 micrometer. A material of the fourth insulating layer includes $SiN_x$, and a thickness of the fourth insulating layer is 0.001 to 0.3 micrometer. The touch electrodes are disposed between the third insulating layer and the fourth insulating layer.

In an embodiment of the disclosure, the aforementioned anti-reflective integrated touch display panel further includes an active device and an electroluminescent device. The electroluminescent device includes a first electrode electrically connected to the active device, a second electrode, and a light emitting layer disposed between the first electrode and the second electrode. The first insulating layer is disposed on the second electrode and is in contact with the second electrode.

In an embodiment of the disclosure, the aforementioned anti-reflective integrated touch display panel further includes a first substrate, a second substrate, a protective layer, and a bonding layer. The anti-reflective structure, the touch electrodes, the active device, and the electroluminescent device are between the first substrate and the second substrate. The vertical distance of the first substrate and the second substrate is 7.5 to 15 micrometers. The adhesive layer is disposed between the protective layer and the second substrate.

In an embodiment of the anti-reflective integrated touch display panel, the plurality of touch electrodes may be integrated into the anti-reflective structure, and then, the anti-reflective integrated touch display panel may be integrated between the first substrate and the second substrate of the anti-reflective integrated touch display panel. Therefore, the need of built-in touch and the thinning effect may be achieved by the anti-reflective integrated touch display panel at the same time. The shift of the neutral axis of the anti-reflective integrated touch display panel is further reduced, so as to improve the flexibility of the anti-reflective integrated touch display panel. The patterned touch electrodes may also be used as a light-shielding layer. The light reflectivity of the anti-reflective integrated touch display panel may be reduced. The impact on the contrast of the anti-reflective integrated touch display panel may be prevented. In addition, the interference from the noise on the anti-reflective integrated touch display panel may be reduced. Moreover, the anti-reflective structure may reduce the reflection of external light and enhance the transmittance. The impact of the external light on the contrast of the anti-reflective integrated touch display panel may thus be prevented, and the brightness of the electroluminescent device is enhanced, so as to improve the display quality of the anti-reflective integrated touch display panel. In addition, a traditional circular polarizer may be replaced by the anti-reflective structure. The manufacturing cost of the anti-reflective integrated touch display panel may be further reduced.

One of the purposes of the disclosure is to enhance the transmittance of the anti-reflective structure.

One of the purposes of the disclosure is to reduce the light reflectivity of the anti-reflective structure.

One of the purposes of the disclosure is to increase the brightness of the electroluminescent device.

One of the purposes of the disclosure is to prevent the impact on the contrast of the anti-reflective integrated touch display panel.

One of the purposes of the disclosure is to improve the display quality of the anti-reflective integrated touch display panel.

One of the purposes of the disclosure is to reduce the manufacturing cost of the anti-reflective integrated touch display panel.

One of the purposes of the disclosure is to provide a thin anti-reflective integrated touch display panel.

One of the purposes of the disclosure is to reduce the shift of the neutral axis of the anti-reflective integrated touch display panel.

One of the purposes of the disclosure is to enhance the flexibility of the anti-reflective integrated touch display panel.

One of the purposes of the disclosure is to reduce the interference from the noise on the anti-reflective integrated touch display panel.

One of the purposes of the disclosure is to enhance the shielding against the noise of the anti-reflective integrated touch display panel.

One of the purposes of the disclosure is to enhance the touch sensitivity of the anti-reflective integrated touch display panel.

One of the purposes of the disclosure is to improve the touch quality of the anti-reflective integrated touch display panel.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
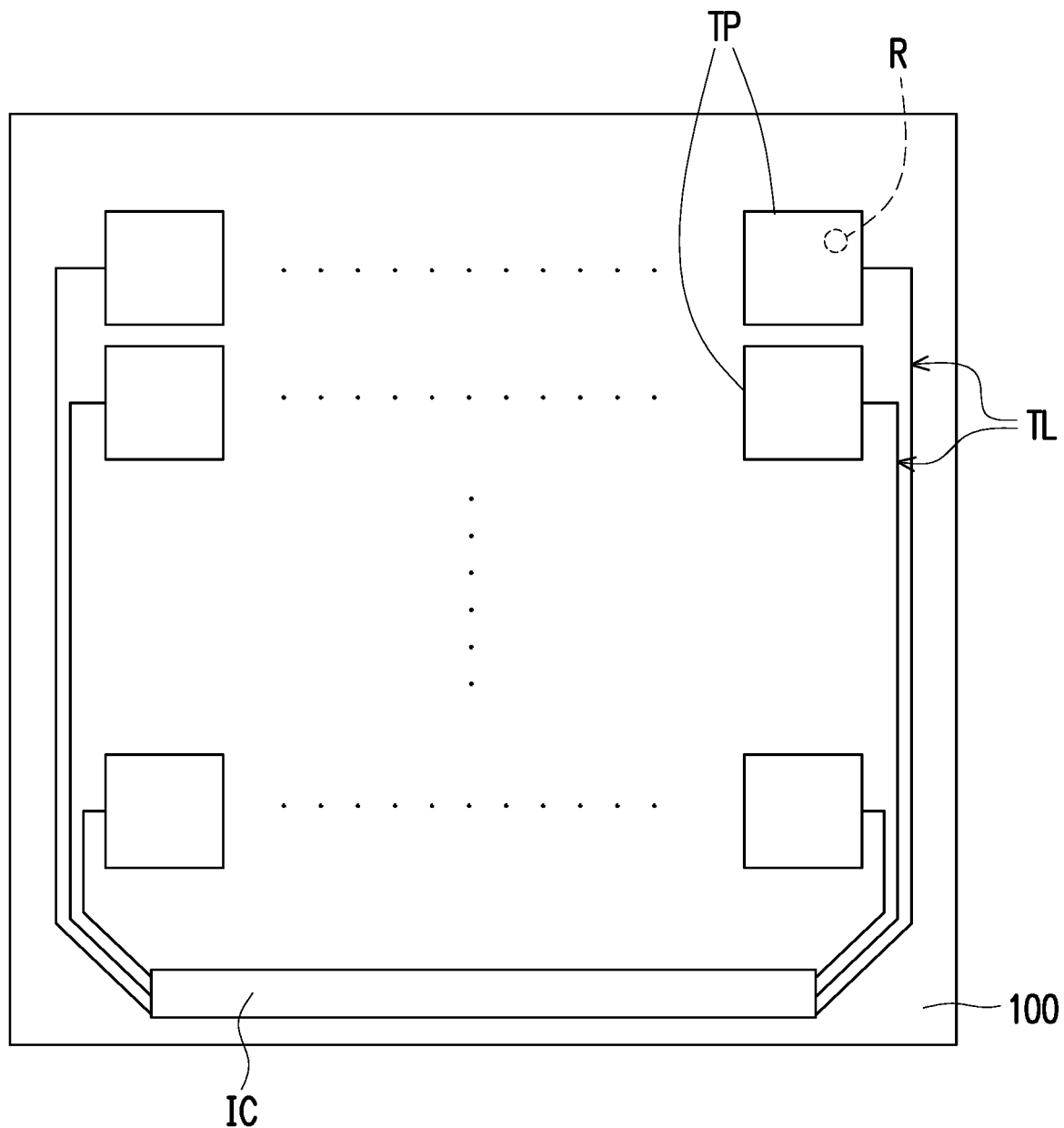
FIG. 1 is a top schematic diagram of an anti-reflective integrated touch display panel according to the first embodiment of this disclosure.
Figure 2:
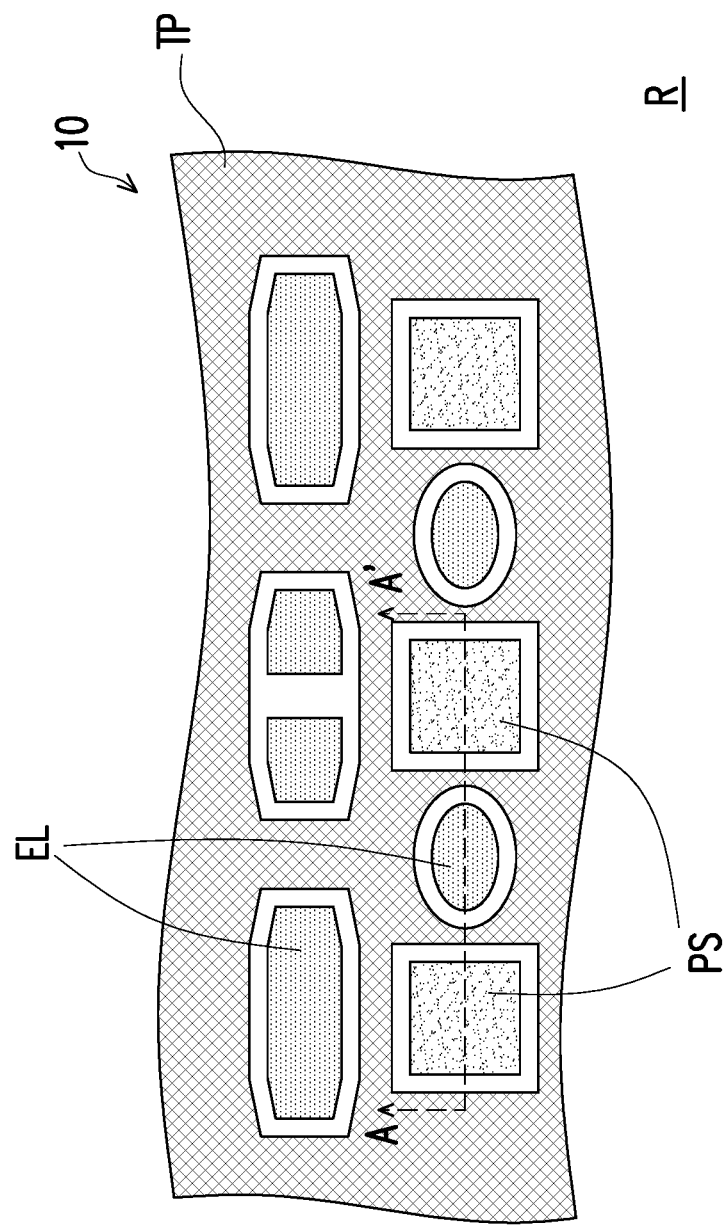
FIG. 2 is a partially enlarged top schematic diagram of a region R in the anti-reflective integrated touch display panel of FIG. 1.
Figure 3:
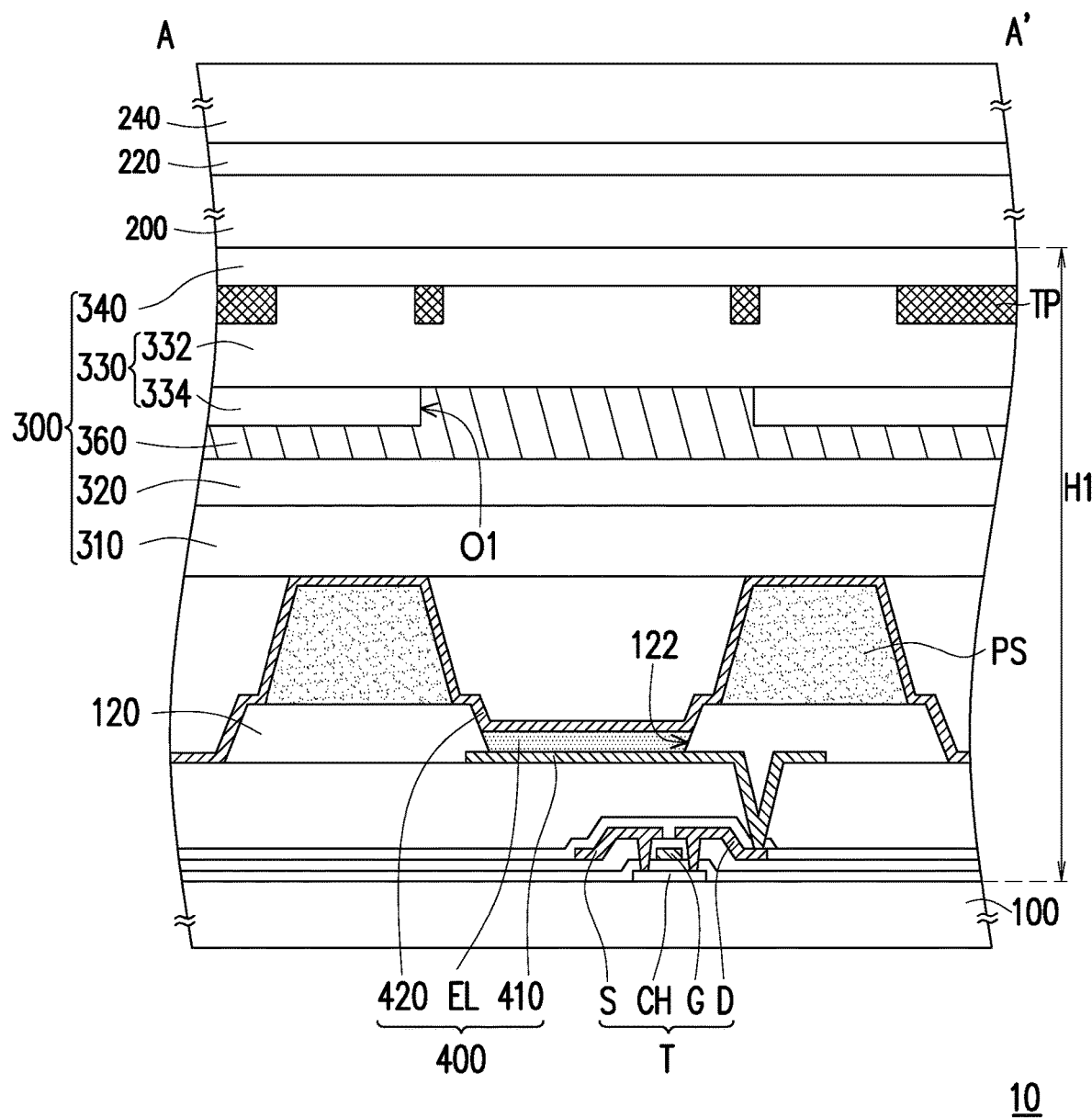
FIG. 3 is a cross-sectional schematic view of the anti-reflective integrated touch display panel of FIG. 2 along a section line AA'.

FIG. 1 is a top schematic diagram of an anti-reflective integrated touch display panel according to the first embodiment of this disclosure. For easier illustration and observation, some elements are omitted in FIG. 1. FIG. 2 is a partially enlarged top schematic diagram of a region R in the anti-reflective integrated touch display panel of FIG. 1. For easier illustration and observation, some elements are omitted in FIG. 2. FIG. 3 is a cross-sectional schematic view of the anti-reflective integrated touch display panel of FIG. 2 along a section line AA'. Please refer to FIG. 1, FIG. 2, and FIG. 3. In the first embodiment of this disclosure, an anti-reflective integrated touch display panel 10 includes an anti-reflective structure 300 and a plurality of touch electrodes TP. In this embodiment, the anti-reflective integrated touch display panel 10 includes a first substrate 100, an anti-reflective structure 300, the touch electrodes TP, a second substrate 200, a protective layer 240, and a bonding layer 220. The anti-reflective structure 300 and the touch electrodes TP are disposed between the first substrate 100 and the second substrate 200. The bonding layer 220 is disposed between the protective layer 240 and the second substrate 200. For example, the protective layer 240 is disposed on the outer side of the second substrate 200 through the bonding layer 220 to preventing the second substrate 200 from being scratched or shocked. In this embodiment, the material of the protective layer 240 may include polyethylene terephthalate (PET), polyimide (PI) or triacetylcellulose (TAC). However, the disclosure is not limited thereto. In this embodiment, a vertical distance H1 of the first substrate 100 and the second substrate 200 is 7.5 to 15 micrometers.

As shown in FIG. 1, in this embodiment, the touch electrodes TP are arranged in an array on the first substrate 100. The material of the first substrate 100 may be glass, quartz, organic polymer or other light transmitting materials. In this embodiment, the first substrate 100 is, for example, an array substrate for carrying OLED packages. However, the disclosure is not limited thereto.

In this embodiment, the anti-reflective integrated touch display panel 10 further includes a plurality of touch signal lines TL. The touch electrodes TP are electrically connected to the touch signal lines TL, respectively. In this embodiment, the touch signal lines TL are respectively electrically connected to the corresponding touch electrodes TP and a driving circuit IC. In this embodiment, the driving circuit IC is, for example, a flexible printed circuit board, a tape carrier package, or a chip on film. However, the disclosure is not limited thereto. In other embodiments, the driving circuit IC may be a gate driver on array (GOA) having driving circuits for touch electrodes disposed on the first substrate 100. In this embodiment, in consideration of conductivity, the touch signal line TL is generally made of a metal material. However, the disclosure is not limited thereto. According to other embodiments, the touch signal line TL may be made of other conductive materials, such as alloys, nitride of metal materials, oxide of metal materials, oxynitride of metal materials, or stacked layers of metal materials and other conductive materials.

Please refer to FIG. 3. In the embodiment, the anti-reflective integrated touch display panel 10 further includes an active device T and an electroluminescent device 400. For example, an active device T is disposed on the first substrate 100. The active device T includes a gate G, a channel layer CH, and a source S and a drain D. The active device T is for example a thin film transistor. In this embodiment, the material of the channel layer CH includes an inorganic semiconductor material or an organic semiconductor material, and the inorganic semiconductor material may be one of amorphous silicon (a-Si), indium gallium zinc oxide (IGZO) or polycrystalline silicon. However, the disclosure is not limited thereto.

In other embodiments, the anti-reflective integrated touch display panel 10 may further include a plurality of scan lines and data lines intersecting with each other and respectively electrically connected to the gate G and the source S. Materials of scan lines, data lines, the gate G, the source S, and the drain D include metal materials, alloys, nitride of metal materials, oxide of metal materials, oxynitride of metal materials, or stacked layers of metal materials and other conductive materials. However, the disclosure is not limited thereto.

In this embodiment, the anti-reflective integrated touch display panel 10 further includes a pixel defining layer 120 and a spacer PS. The pixel defining layer 120 is disposed between the first substrate 100 and the anti-reflective structure 300. For example, the pixel defining layer 120 is disposed on the active device T and has a receiving area 122. The spacer PS is disposed on the pixel defining layer 120. In this embodiment, the electroluminescent device 400 is disposed on the active device T and electrically connected to the active device T.

For example, the electroluminescent device 400 includes a first electrode 410 electrically connected to the active device T, a second electrode 420, and a light emitting layer EL disposed between the first electrode 410 and the second electrode 420. In this embodiment, the first electrode 410 is disposed on the active device T and partially disposed within the receiving area 122. At least a portion of the light-emitting layer EL is disposed within the receiving area 122. The second electrode 420 is disposed on the first substrate 100 and may conformally cover the pixel defining layer 120, the spacer PS, and the light emitting layer EL. In this embodiment, the spacer PS is disposed between the second electrode 420 and the pixel defining layer 120. The materials of the first electrode 410 and the second electrode 420 include transparent conductive materials or opaque conductive materials. The transparent conductive materials may include a conductive metal oxide material, such as indium tin oxide, indium zinc oxide, aluminum tin oxide, aluminum zinc oxide, indium antimony zinc oxide, other suitable oxides, or a stacked layer of at least two of the above conductive metal oxide materials. The opaque conductive material may include a metal. However, the disclosure is not limited thereto. In this embodiment, the material of the light emitting layer EL may include a red organic light emitting material, a green organic light emitting material, a blue organic light emitting material, a white organic light emitting material, another color organic light emitting material, or a combination of the above light emitting materials. In addition, the light-emitting layer EL may further include an electron transporting layer, an electron injecting layer, a hole transporting layer, a hole injecting layer, or a combination of the above four film layers. However, the disclosure is not limited thereto. In this embodiment, the electroluminescent device 400 is illustrated by taking an OLED as an example, but the disclosure is not limited thereto. In other embodiments, the electroluminescent device 400 may include a micro LED, a mini LED, and/or a quantum dot LED. The electroluminescent device 400 is a top light-emitting type of the light-emitting device and emits light in the direction toward the second substrate 200 to display an image, so that an observer at the side of the second substrate 200, that is, the outside of the protective layer 240, may observe images.

It should be noted that, with reference to FIG. 3, the anti-reflective integrated touch display panel 10 of this embodiment includes an anti-reflective structure 300, and the anti-reflective structure 300 is disposed on the electroluminescent device 400. For example, the anti-reflective structure 300 includes a first insulating layer 310, a second insulating layer 320 disposed on the first insulating layer 310, a conductive layer 360 disposed on the second insulating layer 320, a third insulating layer 330 disposed on the second insulating layer 320, and a fourth insulating layer 340 disposed on a third insulating layer 330. For example, when the anti-reflection integrated touch display panel 10 is designed with the following film layers and thicknesses as listed in Table 1, the anti-reflective structure 300 has a light reflectivity at about 1% to 2%, and the transmittance may be more than 52%, and has good optical properties.

TABLE 1

| Film layer | Thickness (micrometer) |
|---|---|
| Pixel defining layer | 1.2 |
| Spacer | 1.7 |
| Second electrode | 0.18 |
| First insulating layer | 0.25 |
| Second insulating layer | 0.02 |
| Conducting layer | 0.01 |
| Second sub-insulating layer | 0.5 |
| First sub-insulating layer | 0.8 |
| Touch electrodes | 0.25 |
| Fourth insulating layer | 0.3 |
| Second substrate | 200 |
| Bonding layer | 200 |
| Protective layer | 1400 |

Figure 4A:
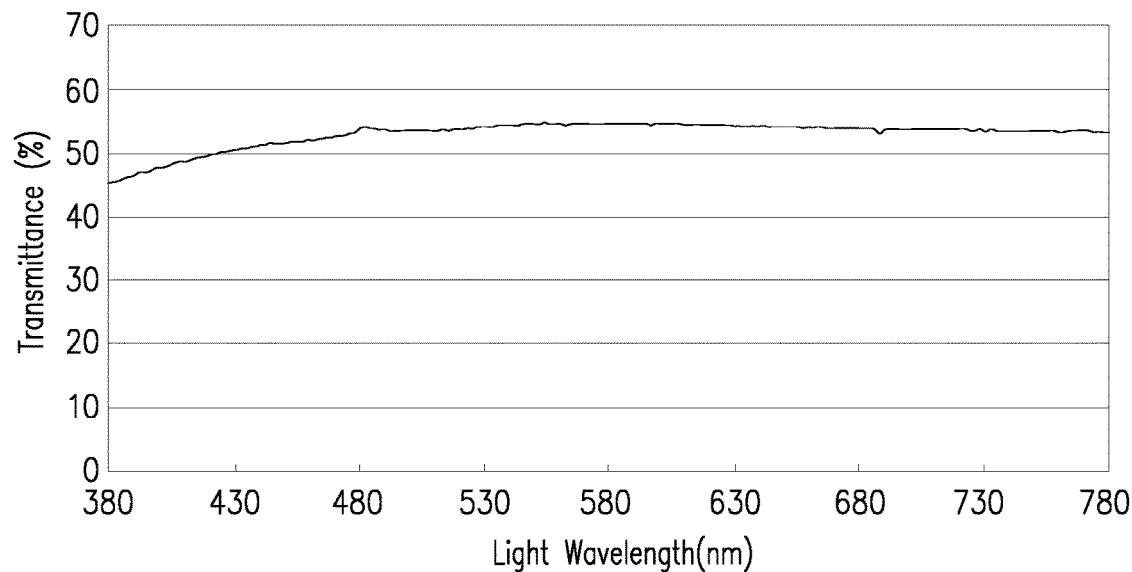
FIG. 4A is a graph illustrating the relationship between visible light wavelength and the transmittance of the anti-reflective structure.
Figure 4B:
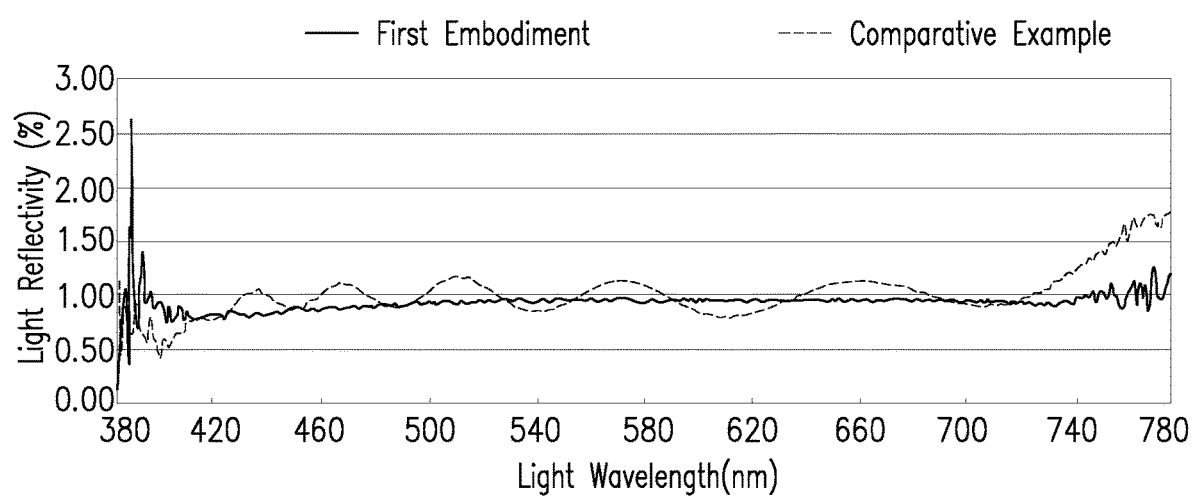
FIG. 4B is a graph illustrating the relationship between visible light wavelength and the light reflectivity of the anti-reflective structure.

FIG. 4A is a graph illustrating the relationship between visible light wavelength and the transmittance of the anti-reflective structure. FIG. 4B is a graph illustrating the relationship between visible light wavelength and the light reflectivity of the anti-reflective structure. According to the experimental data of FIG. 4A, when the visible light wavelength is, for example, between the light wavelength range of 380 nm and 780 nm, the anti-reflective structure 300 of the anti-reflective integrated touch display panel 10 of an embodiment of this disclosure has 52% or more of the transmittance. For example, the transmittance of the anti-reflective structure 300 is 52% or more under the light source with a wavelength of 440 nm, the transmittance of the anti-reflective structure 300 is 54% or more under the light source with a wavelength of 550 nm, and when the transmittance of the anti-reflective structure 300 is 54% or more under the light source with a wavelength of 610 nm, the anti-reflective structure 300 has good transmittance. According to the experimental data of FIG. 4B, when the visible light wavelength is, for example, between the wavelength range of 380 nm and 780 nm, the anti-reflective structure 300 of the anti-reflective integrated touch display panel 10 of an embodiment of this disclosure has around 1-2% light reflectivity. Compared with the conventional circular polarizer used in the comparative example, the light reflectivity of the anti-reflective structure 300 of the first embodiment of this disclosure is substantially the same as that of the conventional circular polarizer, and the reflection of the external light is thus reduced. The light reflectivity of the anti-reflective structure 300 is reduced, and the use of the conventional circular polarizer may be omitted.

A manufacturing method of the anti-reflective integrated touch display panel 10 of this embodiment is briefly illustrated in one embodiment as bellow. It should be noted that similar descriptions of the same technical content are omitted below. Regarding the omitted descriptions, please refer to the aforementioned embodiments, and shall not be repeated in the following embodiments.

In this embodiment, the fourth insulating layer 340 is first disposed on the second substrate 200. A material of the second substrate 200 may be glass, quartz, organic polymer or other light transmitting materials. In this embodiment, the second substrate 200 is used as, for example, a package cover of the anti-reflective integrated touch display panel 10. However, the disclosure is not limited thereto. A thickness of the second substrate 200 is around 200 micrometers. However, the disclosure is not limited thereto. The fourth insulating layer 340 is disposed by, for example, adopting chemical vapor deposition (CVD), depositing the fourth insulating layer 340 on the second substrate 200. In this embodiment, the material of the fourth insulating layer 340 includes silicon nitride ($SiN_x$). However, the disclosure is not limited thereto. A thickness of the fourth insulating layer 340 is a thickness of 0.001 to 0.3 micrometer. With the aforementioned configuration, the fourth insulating layer 340 may be served as a refractive/reflective interference thin film of the external light entering the anti-reflective structure 300.

Then, the third insulating layer 330 is disposed on the fourth insulating layer 340. The third insulating layer 330 is disposed by, for example, through adopting chemical vapor deposition (CVD) method, depositing the third insulating layer 330 on the fourth insulating layer 340. For example, the third insulating layer 330 includes a first sub-insulating layer 332 and a second sub-insulating layer 334. In this embodiment, materials of the first sub-insulating layer 332 and the second sub-insulating layer 334 may be the same or different, and silicon oxide ($Si_xO_y$) or silicon nitride ($SiN_x$) is included. However, the disclosure is not limited thereto. A thickness of the first sub-insulating layer 332 is 0.1 to 2 micrometers, and a thickness of the second sub-insulating layer 334 is 0.1 to 2 micrometers. However, the disclosure is not limited thereto. In this embodiment, the second sub-insulating layer 334 has a plurality of openings O1, and the openings O1 are respectively corresponded to the light-emitting layer EL. However, the disclosure is not limited thereto.

Next, a conducting layer 360 is disposed on the third insulating layer 330. A deposition of the conducting layer 360 is, for example, a sputtering deposition technique. In this embodiment, a material of the conducting layer 360 includes molybdenum. However, the disclosure is not limited thereto. A thickness of a conducting layer 360 is 0.01 to 0.05 micrometer. In this embodiment, the conducting layer 360 is disposed on the second sub-insulating layer 334, and at least a portion of the conducting layer 360 is filled in the openings O1 to be in contact with the first sub-insulating layer 332. The aforementioned film structures may be used as anti-reflection layers of the anti-reflective structure 300, and the light reflectivity is about 1% to 2% in the range of the visible light band (about 380 nm to about 780 nm). The light reflection of the external light may be blocked, and the light reflectivity of the anti-reflective structure 300 is reduced. In addition, when the conducting layer 360 is between the aforementioned thickness range, the anti-reflective structure 300 may have a transmittance of more than 52%, and the anti-reflective structure 300 thus has a good transmittance and the brightness of the electroluminescent device 400 is enhanced.

Then, the second insulating layer 320 is disposed on the conducting layer 360. The second insulating layer 320 is disposed by, for example, through adopting the CVD method, depositing a Si-rich and/or strontium (Sr) material on the conducting layer 360 as the second insulating layer 320. In this embodiment, the material of the second insulating layer 320 includes silicon oxide ($Si_xO_y$) or strontium oxide (SrO). However, the disclosure is not limited thereto. A thickness of the second insulating layer 320 is 0.001 to 0.1 micrometer. Under the above deposition, the anti-reflective structure 300 enhances the transmittance under the blue-light by the second insulating layer 320 and the low light reflectivity may be maintained.

Then, the first insulating layer 310 is disposed on the second insulating layer 320. The first insulating layer 310 is, for example, a passivation layer. The first insulating layer 310 is disposed by, for example, through adopting the CVD method, depositing the first insulating layer 310 on the second insulating layer 320. In this embodiment, the material of the first insulating layer 310 includes silicon oxide ($Si_xO_y$) or silicon nitride ($SiN_x$). However, the disclosure is not limited thereto. A thickness of the first insulating layer 310 is 0.1 to 2 micrometers. Under the above configuration, by depositing the first insulating layer 310, the anti-reflective structure 300 may be protected from damage and malfunction when the anti-reflective structure 300 is bonded toward to the first substrate 100.

Next, the anti-reflective structure 300 is bonded to the electroluminescent device 400. In this embodiment, the first insulating layer 310 is disposed on the second electrode 420 of the electroluminescent device 400 and may be in contact with the second electrode 420. A thickness of the second electrode 420 is about 0.18 micrometer. However, the disclosure is not limited thereto. The second insulating layer 320 is disposed on the first insulating layer 310. The conducting layer 360 is disposed on the second insulating layer 320. The third insulating layer 330 is disposed on the second insulating layer 320. The fourth insulating layer 340 is disposed on the third insulating layer 330 and is in contact with the second substrate 200. Under the above configuration, the anti-reflective structure 300, the active device T and the electroluminescent device 400 are disposed between the first substrate 100 and the second substrate 200. The anti-reflective structure 300 is thus integrated into the anti-reflective integrated touch display panel 10. An overall thickness of the anti-reflective integrated touch display panel 10 may be reduced, and the thinning effect on the lighter anti-reflective integrated touch display panel 10 may be achieved. Moreover, a shift of the neutral axis of the anti-reflective integrated touch display panel 10 may be further reduced to enhance the flexibility of the anti-reflective integrated touch display panel 10.

The touch electrodes TP of this embodiment is disposed between the third insulating 330 and the fourth insulating layer 340. A material of the touch electrodes TP includes molybdenum, indium tin oxide or indium zinc oxide. A thickness of the touch electrode TP is 0.1 to 2 micrometers. In this embodiment, the anti-reflective integrated touch display panel 10 may be integrated into the anti-reflective structure 300. In addition, the touch electrodes TP are specifically disposed between the third insulating layer 330 and the fourth insulating layer 340, and are in contact with the third insulating layer 330 and the fourth insulating layer 340. Therefore, the overall thickness of the anti-reflective integrated touch display panel 10 is further reduced and the shift of the neutral axis of the anti-reflective integrated touch display panel 10 is reduced to enhance the flexibility of the anti-reflective integrated touch display panel 10, and good transmittance and light reflectivity of the anti-reflective structure 300 are maintained.

In this embodiment, the anti-reflective integrated touch display panel 10 may meet the requirements of an in-cell touch panel by the touch electrodes TP being further integrated into the anti-reflective structure 300. Please refer to FIG. 1, FIG. 2 and FIG. 3. Take the region R on one of the touch electrodes TP as an example. In this embodiment, by patterning the touch electrodes TP to form the openings (not marked) so as to respectively expose the light-emitting layers EL and/or the spacers PS. However, the disclosure is not limited thereto. In this way, the patterned touch electrodes TP may also serve as a light shielding layer to reduce the light reflectivity of the anti-reflective integrated touch display panel 10, so as to reduce the reflection of external light and prevent the impact on the contrast of the anti-reflection integrated touch display panel 10. In addition, since the opening formed in the touch electrodes TP is at the position corresponding to spacer PS, the impact on the touch electrodes TP by the second electrode 420 formed on the spacer PS may be reduced. Thus, the interference from the noise onto the anti-reflective integrated touch display panel 10 is reduced.

In addition, in this embodiment, the first sub-insulating layer 332 is disposed between the touch electrodes TP and the conducting layer 360, and the second sub-insulating layer 334 is disposed between the first sub-insulating layer 332 and the second insulating layer 320. In this way, the touch electrodes TP may maintain a certain distance from the conducting layer 360, and further avoid affecting the touch sensitivity of the anti-reflective integrated touch display panel 10.

In this embodiment, since the refractive index of the second substrate 200 is different from the refractive index of the fourth insulating layer 340 of the anti-reflective structure 300, after the external light enters the anti-reflective structure 300, a destructive thin film interference is generated by phase differences to reduce the reflection of the external light. In addition, apart from being used as an anti-reflective layer, the conducting layer 360 has an ultra-thin thickness range that enables the transmittance of the anti-reflective structure 300 to be more than 52%, improving the transmittance of the anti-reflective structure 300. Furthermore, through a thickness design of the second insulating layer 320, the transmittance of the anti-reflective structure 300 may be enhanced under the light source with blue light, so as to enhance the brightness of the electroluminescent device 400.

In short, since the touch electrodes TP of an embodiment of this disclosure may be integrated into the anti-reflective structure 300, and the anti-reflective structure 300 may be further integrated between the first substrate 100 and the second substrate 200 of the anti-reflective integrated touch display panel 10, the need of built-in touch and the thinning effect on the anti-reflective integrated touch display panel 10 may be achieved. The shift of the neutral axis of the anti-reflective integrated touch display panel may be further reduced, so as to improve the flexibility of the anti-reflective integrated touch display panel. The patterned touch electrodes TP may also be used as a light-shielding layer. The light reflectivity of the anti-reflective integrated touch display panel 10 may be reduced. The impact on the contrast of the anti-reflective integrated touch display panel 10 may be prevented. In addition, the interference from the noise on the anti-reflective integrated touch display panel 10 may be reduced. Moreover, the anti-reflective structure 300 may reduce the reflection of external light and enhance the transmittance at the same time. The impact of the external light on the contrast of the anti-reflective integrated touch display panel may thus be prevented, and the brightness of the electroluminescent device 400 is enhanced, so as to improve the display quality of the anti-reflective integrated touch display panel. In addition, the traditional circular polarizers may be replaced by the anti-reflective structure 300. The manufacturing cost of the anti-reflective integrated touch display panel 10 may be further reduced.

The embodiments below follow the reference numerals and parts of the aforementioned embodiments, wherein the same reference numerals are used for the same or similar elements, and explanations for the same technical contents are omitted. For the descriptions of the omitted parts, reference may be made to the foregoing embodiment, and will not be repeated in the following embodiments.

Figure 5:
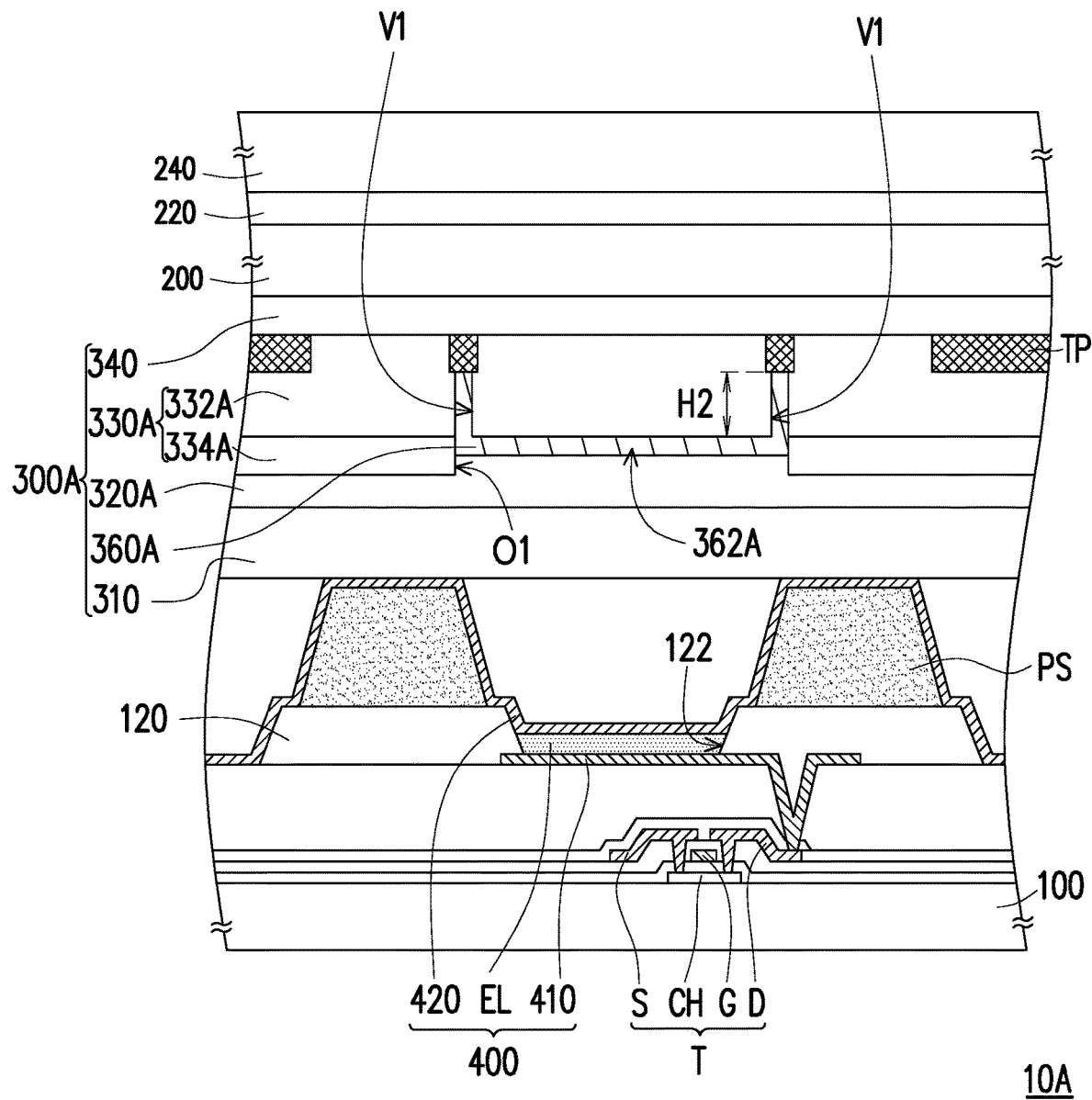
FIG. 5 is a cross-sectional view showing an anti-reflective integrated touch display panel of a second embodiment of this disclosure.

FIG. 5 is a cross-sectional view of an anti-reflective integrated touch display panel of a second embodiment of this disclosure. For easier illustration and observation, only one block 362A and one corresponding opening O1 are shown. An anti-reflective integrated touch display panel 10A was designed by using film layers and the thickness thereof as listed below in Table 2. Please refer to FIG. 3 and FIG. 5. The anti-reflective integrated touch display panel 10A of the second embodiment of this disclosure is similar to the anti-reflective integrated touch display panel 10 of FIG. 3. The main difference is that: a conducting layer 360A is electrically connected to the touch electrodes TP. In this embodiment, the conducting layer 360A includes a plurality of blocks 362A. The blocks 362A are respectively disposed in the opening O1 of the second sub-insulating layer 334A. In this embodiment, at least a portion of the second insulating layer 320A may be filled in the openings O1. However, the disclosure is not limited thereto.

TABLE 2

| Film layer | Thickness (micrometer) |
|---|---|
| Pixel defining layer | 1.2 |
| Spacer | 1.7 |
| Second electrode | 0.18 |
| First insulating layer | 0.25 |
| Second insulating layer | 0.02 |
| Conducting layer | 0.01 |
| Second sub-insulating layer | 0.5 |
| First sub-insulating layer | 0.8 |
| Touch electrodes | 0.25 |
| Fourth insulating layer | 0.3 |
| Second substrate | 200 |
| Bonding layer | 200 |
| Protective layer | 1400 |

In this embodiment, the blocks 362A are electrically connected to the electrodes TP, respectively. For example, the first sub-insulating layer 332A has a plurality of contact holes V1, and the blocks 362A of the conducting layer 360A are disposed in the opening O1 and is in contact with the first sub-insulating layer 332A. The blocks 362A are electrically connected to the touch electrodes TP through the contact holes V1, respectively. In this embodiment, the vertical distance H2 of the conducting layer 360A and the touch electrodes TP is 0.1 to 2 micrometers. Under the above configuration, the conducting layer 360A may be disposed only in the opening O1 of the corresponding light-emitting layer EL instead of on the entire surface of second insulating layer 320A. In this way, in addition to partially improving the transmittance of the anti-reflective structure 300A for the light-emitting layer EL, the influence of the conducting layer 360A on the capacitance of the plurality of touch electrodes TP may be reduced, and noise generation may be avoided.

In the embodiment of this disclosure, please refer to the simulated data listed in Table 3: the capacity of the touch electrodes of the first embodiment of this disclosure is larger than the capacity of the touch electrodes of the comparative example to which the circular polarizer is attached outside the package cover and has higher signal strength (picofarad, pF). The capacity of the touch electrodes of the second embodiment of this disclosure is larger than the capacity of the touch electrodes of the comparative example to which the circular polarizer is attached, and has a higher signal intensity. The conducting layer 360A is also disposed in the opening O1 and the touch electrodes TP are electrically connected to each other through the conducting layer 360A and the contact holes V1, so that the noise shielding of an anti-reflective integrated touch display panel 10A may be improved. Compared with the comparative example, the anti-reflective integrated touch display panel 10A of the second embodiment of this disclosure may greatly reduce the noise and has a better signal-to-noise ratio. Therefore, in addition to reducing external light reflection and improving transmittance, the anti-reflective structure 300A may also improve the touch sensitivity of the anti-reflective integrated touch display panel 10A and improve the touch quality of the anti-reflective integrated touch display panel 10A.

TABLE 3

| Item | Comparative Example | First Embodiment | Second Embodiment |
| --- | --- | --- | --- |
| Capacitor of touch electrodes (pF) | 127.1 | 317.5 | 793.5 |
| Signal (pF) | 0.649 | 0.696 | 1.02 |
| Noise (pF) | 0.249 | 0.322 | 0.000018 |
| Signal-to-noise ratio (SNR) | 2.6 | 2.16 | 57880 |

In summary, the anti-reflective integrated touch display panel of the embodiment of this disclosure integrates the anti-reflective structure into the anti-reflective integrated touch display panel by integrating the touch electrodes into the anti-reflective structure, and further integrating the anti-reflective structure between the first substrate and the second substrate. Therefore, the need of built-in touch and the thinning effect on the anti-reflective integrated touch display panel may be achieved. The shift of the neutral axis of the anti-reflective integrated touch display panel is further reduced, so as to improve the flexibility of the anti-reflective integrated touch display panel. The patterned touch electrodes may also be used as a light-shielding layer. The light reflectivity of the anti-reflective integrated touch display panel may be reduced. The impact on the contrast of the anti-reflective integrated touch display panel may be prevented. In addition, the interference from the noise on the anti-reflective integrated touch display panel may be reduced. Moreover, the anti-reflective structure may reduce the reflection of external light and enhance the transmittance at the same time. The impact of the external light on the contrast of the anti-reflective integrated touch display panel may thus be prevented, and the brightness of the electroluminescent device is enhanced, so as to improve the display quality of the anti-reflective integrated touch display panel. In addition, the traditional circular polarizer may be replaced by anti-reflective structures. The manufacturing cost of the anti-reflective integrated touch display panel may be further reduced. Furthermore, since the anti-reflective structure improves the noise shielding of the anti-reflective integrated touch display panel to greatly reduce the interference from the noise on the touch electrodes, the touch sensitivity of the anti-reflective integrated touch display panel may be improved, and the touch quality of the anti-reflective integrated touch display panel may be improved at the same time.

Although the disclosure is disclosed as the embodiments above, the embodiments are not meant to limit the disclosure. Any person skilled in the art may make slight modifications and variations without departing from the spirit and scope of the disclosure. Therefore, the protection scope of the disclosure shall be defined by the claims attached below.

What is claimed is:

1. An anti-reflective integrated touch display panel, comprising:
    an anti-reflective structure, comprising:
        a first insulating layer, wherein a material of the first insulating layer comprises silicon oxide or silicon nitride, and a thickness of the first insulating layer is 0.1 to 2 micrometers;
        a second insulating layer disposed on the first insulating layer, wherein a material of the second insulating layer comprises silicon oxide or strontium oxide, and a thickness of the second insulating layer is 0.001 to 0.1 micrometer;
        a conducting layer disposed on the second insulating layer, wherein a material of the conducting layer comprises molybdenum, and a thickness of the conducting layer is 0.01 to 0.05 micrometer;
        a third insulating layer disposed on the second insulating layer; and
        a fourth insulating layer disposed on the third insulating layer, wherein a material of the fourth insulating layer comprises silicon nitride, and a thickness of the fourth insulating layer is 0.001 to 0.3 micrometer; and
    a plurality of touch electrodes disposed between the third insulating layer and the fourth insulating layer.

2. The anti-reflective integrated touch display panel according to claim 1, further comprising:
    an active device; and
    an electroluminescent device, comprising:
        a first electrode, electrically connected to the active device;
        a second electrode, wherein the first insulating layer is disposed on the second electrode and is in contact with the second electrode; and
        a light emitting layer is disposed between the first electrode and the second electrode.

3. The anti-reflective integrated touch display panel according to claim 2, wherein the third insulating layer comprises:
    a first sub-insulating layer disposed between the touch electrodes and the conducting layer, wherein a material of the first sub-insulating layer comprises silicon oxide or silicon nitride, and a thickness of the first sub-insulating layer is 0.1 to 2 micrometers; and
    a second sub-insulating layer disposed between the first sub-insulating layer and the second insulating layer, wherein a material of the second sub-insulating layer comprises silicon oxide or silicon nitride, and a thickness of the second sub-insulating layer is 0.1 to 2 micrometers.

4. The anti-reflective integrated touch display panel according to claim 3, wherein the conducting layer comprises a plurality of blocks electrically connected to the touch electrodes respectively.

5. The anti-reflective integrated touch display panel according to claim 4, wherein the second sub-insulating layer has a plurality of openings, and the blocks are disposed in the openings respectively.

6. The anti-reflective integrated touch display panel according to claim 4, wherein the first sub-insulating layer has a plurality of contact holes, and the blocks are electrically connected to the touch electrodes via the contact holes respectively, wherein a vertical distance between the conducting layer and the corresponding touch electrode is 0.1 to 2 micrometers.

7. The anti-reflective integrated touch display panel according to claim 2, further comprising:
- a pixel defining layer disposed on the active device and having a receiving area, wherein at least one portion of the light emitting layer is disposed within the receiving area; and
- a spacer disposed on the pixel defining layer, wherein the spacer is disposed between the second electrodes and the pixel defining layer.

8. The anti-reflective integrated touch display panel according to claim 2, further comprising:
- a plurality of touch signal lines, wherein the touch electrodes are electrically connected to the touch signal lines respectively, and the touch electrodes comprise molybdenum, indium tin oxide or indium zinc oxide, and a thickness of each of the touch electrodes is 0.1 to 2 micrometers.

9. The anti-reflective integrated touch display panel according to claim 8, wherein the touch electrodes are disposed between the third insulating layer and the fourth insulating layer.

10. The anti-reflective integrated touch display panel according to claim 9, further comprising:
- a first substrate;
- a second substrate, wherein the anti-reflective structure, the touch electrodes, the active device, and the electroluminescent device are disposed between the first substrate and the second substrate, wherein a vertical distance between the first substrate and the second substrate is 7.5 to 15 micrometers;
- a protective layer; and
- a bonding layer disposed between the protective layer and the second substrate.

* * * * *